United States Patent
Vavilov et al.

(10) Patent No.: US 10,572,816 B1
(45) Date of Patent: Feb. 25, 2020

(54) SYSTEM AND METHOD FOR CONTROLLING SUPERCONDUCTING QUBITS

(71) Applicants: Wisconsin Alumni Research Foundation, Madison, WI (US); University of Massachusetts, Boston, MA (US); University of Maryland, College Park, MD (US)

(72) Inventors: Maxim George Vavilov, Middleton, WI (US); Konstantin Nesterov, Madison, WI (US); Vladimir Manucharyan, College Park, MD (US); Ivan Pechenezhskiy, Silver Springs, MD (US); Chen Wang, Amherst, MA (US)

(73) Assignees: Wisconsin Alumni Research Foundation, Madison, WI (US); University of Massachusetts, Boston, MA (US); University of Maryland, College Park, College park, MD (US)

(*) Notice: Subject to any disclaimer, the term of this patent is extended or adjusted under 35 U.S.C. 154(b) by 0 days.

(21) Appl. No.: 16/210,921

(22) Filed: Dec. 5, 2018

(51) Int. Cl.
*G06N 10/00* (2019.01)
*H03K 19/195* (2006.01)

(52) U.S. Cl.
CPC .......... *G06N 10/00* (2019.01); *H03K 19/195* (2013.01)

(58) Field of Classification Search
None
See application file for complete search history.

(56) References Cited

U.S. PATENT DOCUMENTS

| | | | | |
|---|---|---|---|---|
| 7,253,654 B2* | 8/2007 | Amin | .............. | B82Y 10/00 326/3 |
| 8,106,717 B2* | 1/2012 | Ichimura | ............ | B82Y 10/00 331/94.1 |
| 9,663,358 B1* | 5/2017 | Cory | .............. | B82Y 10/00 |
| 9,735,776 B1* | 8/2017 | Abdo | .............. | G06N 10/00 |
| 10,056,908 B2* | 8/2018 | Rigetti | ............ | G01R 33/02 |
| 2005/0001209 A1* | 1/2005 | Hilton | ............ | B82Y 10/00 257/20 |

(Continued)

OTHER PUBLICATIONS

Barends, Rami, et al. "Coherent Josephson qubit suitable for scalable quantum integrated circuits." Physical review letters 111.8 (2013): 080502.

(Continued)

*Primary Examiner* — Crystal L Hammond
(74) *Attorney, Agent, or Firm* — Quarles & Brady LLP (57) ABSTRACT

A system and method for controlling qubits to perform quantum computation is provided. In some aspects, the system includes at least one superconducting quantum processor comprising a multi-qubit architecture having coupled qubits that are described by an anharmonic energy spectrum. The system also includes a microwave source connected to the at least one superconducting quantum processor, and configured to provide a microwave irradiation to at least one of the coupled qubits in the multi-qubit architecture to perform a gate on the at least one of the coupled qubits. The system further includes a controller configured to direct the microwave source to provide the microwave irradiation to at least one of the coupled qubits in the multi-qubit architecture.

20 Claims, 11 Drawing Sheets

(56) References Cited

U.S. PATENT DOCUMENTS

| | | | | |
|---|---|---|---|---|
| 2006/0249670 | A1* | 11/2006 | Monroe | G06N 10/00 250/283 |
| 2015/0358022 | A1* | 12/2015 | McDermott, III | H03K 19/1958 326/5 |
| 2016/0087599 | A1* | 3/2016 | Naaman | H03H 7/20 333/139 |
| 2016/0191060 | A1* | 6/2016 | McDermott, III | H03K 19/1954 326/3 |
| 2018/0260729 | A1* | 9/2018 | Abdo | G06N 99/00 |
| 2018/0365585 | A1* | 12/2018 | Smith | G06F 9/546 |
| 2019/0042392 | A1* | 2/2019 | Matsuura | G06N 10/00 |

OTHER PUBLICATIONS

Bialczak, Radoslaw C., et al. "Quantum process tomography of a universal entangling gate implemented with Josephson phase qubits." Nature Physics 6.6 (2010): 409.

Chen, Yu, et al. "Qubit architecture with high coherence and fast tunable coupling." Physical review letters 113.22 (2014): 220502.

Chow, Jerry M., et al. "Microwave-activated conditional-phase gate for superconducting qubits." New Journal of Physics 15.11 (2013): 115012.

Chow, J. M., et al. "Randomized benchmarking and process tomography for gate errors in a solid-state qubit." Physical review letters 102.9 (2009): 090502.

Chow, Jerry M., et al. "Simple all-microwave entangling gate for fixed-frequency superconducting qubits." Physical review letters 107.8 (2011): 080502.

Dicarlo, Leonardo, et al. "Demonstration of two-qubit algorithms with a superconducting quantum processor." Nature 460.7252 (2009): 240.

Geller, Michael R., et al. "Tunable coupler for superconducting Xmon qubits: Perturbative nonlinear model." Physical Review A 92.1 (2015): 012320.

Ghosh, Joydip, et al. "High-fidelity controlled-s z gate for resonator-based superconducting quantum computers." Physical Review A 87.2 (2013): 022309.

Koch, Jens, et al. "Charging effects in the inductively shunted Josephson junction." Physical review letters 103.21 (2009): 217004.

Leek, P. J., et al. "Using sideband transitions for two-qubit operations in superconducting circuits." Physical Review B 19.18 (2009): 180511.

Lin, Yen-Hsiang, et al. "Demonstration of Protecting a superconducting qubit from energy decay." Phys. Rev. Lett. 120, 150503 (2018).

Majer, J., et al. "Coupling superconducting qubits via a cavity bus." Nature 449.7161 (2007): 443.

Manucharyan, Vladimir E., et al. "Fluxonium: Single cooper-pair circuit free of charge offsets." Science 326.5949 (2009):113-116.

McKay, David C., et al. "Universal gate for fixed-frequency qubits via a tunable bus." Physical Review Applied 6.6 (2016): 064007.

Niesterov, Konstantin N., et al. "Microwave-activated controlled-Z gate for fixed-frequency fluxonium qubits." Physical Review A 98.3 (2018): 030301.

Nguyen, Long B., et al. "The high-coherence fluxonium qubit." arXiv preprint arXiv:1810.11006 (2018).

Paik, Hanhee, et al. "Experimental demonstration of a resonator-induced phase gate in a multiqubit circuit-qed system." Physical review letters 117.25 (2016): 250502.

Rigetti, Chad, and Michel Devoret. "Fully microwave-tunable universal gates in superconducting qubits with linear couplings and fixed transition frequencies." Physical Review B 81.13 (2010): 134507.

Sheldon, Sarah, et al. "Procedure for systematically tuning up cross-talk in the cross-resonance gate." Physical Review A 93.6 (2016): 060302.

Song, Chao, et al. "10-qubit entanglement and parallel logic operations with a superconducting circuit." Physical review letters 119.18 (2017): 180511.

Strauch, Frederick W., et al. "Quantum logic gates for coupled superconducting phase qubits." Physical review letters 91.16 (2003): 167005.

Zhu, Guanyu, et al. "Circuit QED with fluxonium qubits: Theory of the dispersive regime." Physical Review B 87.2 (2013): 024510.

Zhu, Guanyu, and Jens Koch. "Asymptotic expressions for charge-matrix elements of the fluxonium circuit" Physical Review B 87.14 (2013): 144518.

* cited by examiner

SYSTEM AND METHOD FOR CONTROLLING SUPERCONDUCTING QUBITS

STATEMENT REGARDING FEDERALLY SPONSORED RESEARCH/DEVELOPMENT

This invention was made with government support under W911NF-15-1-0248 awarded by the ARMY/ARO. The government has certain rights in the invention.

BACKGROUND

The present disclosure relates to superconducting circuits. More particularly, the disclosure relates to systems and methods for quantum information processing and quantum computation.

In the field of quantum computation, the performance of quantum bits ("qubits") has advanced rapidly in recent years, with preliminary multi-qubit implementations leading toward surface code architectures. In contrast to classical computational methods that rely on binary data stored in the form of definite on/off states, or bits, quantum computation takes advantage of the quantum mechanical nature of quantum systems. Specifically, quantum systems are described using a probabilistic approach, whereby each system includes quantized energy levels whose state may be represented using a superposition of multiple quantum states.

Superconductor-based qubits represent good candidates for quantum computation because of the low dissipation inherent in superconducting materials, and the long coherence times required for performing useful operations. In addition, superconducting circuits can be micro-fabricated using conventional integrated-circuit processing techniques, which, in principle, allows for a large number of superconducting qubits to be produced. However, scaling up from a few qubits to a large-scale qubit architecture present a number of technical challenges. Specifically, quantum measurement and control becomes increasingly more difficult, and requires additional resources, infrastructure and complexity.

Transmon qubits, in particular, have been largely responsible for the significant breakthrough in superconducting quantum information processing over the last decade. The transmon qubit is a modification of the traditional Cooper-pair box (CPB) qubit, which is formed using a superconducting island connected to a grounded reservoir via a Josephson junction. Cooper pairs can tunnel onto the superconducting island, and charge being adjustable by a gate capacitively coupled to the island. However, the islands are exposed to random electric fields from fluctuating charged impurities, which leads to charge noise that affects coherence of the qubit. To address this issue, the transmon qubit includes a large shunting capacitance in addition to CPB qubit structure. As a result, the transmon qubit has been shown to be capable of achieving long coherence times, high-fidelity gates, and reliable readout.

However, the weak anharmonicity of the transmon qubit presents a substantial challenge in pushing the fidelities higher. Fundamentally, the main issue is that both qubit memory and qubit interaction is obtained using transitions with nearly identical frequencies and matrix elements. This prevents the decoupling of the qubits from their dissipative environment, e.g., due to the dielectric loss, without proportionally increasing the gate time. Moreover, in larger arrays, it becomes harder to address individual qubits without affecting other qubits. This is because stronger coupling between transmon qubits requires a smaller detuning of their frequencies, which in turn enhances the uncontrolled state leakage outside of the computational subspace.

In atomic systems, qubit states are chosen in such a way that the transition between them is forbidden by the selection rules to provide long coherence in the computational sub-space. Quantum gates and qubit readout are performed through transitions outside of that sub-space with stronger coupling to electromagnetic fields. Such separation of quantum states for information storage and processing allows one to perform many high-fidelity gates before the qubit state is spoiled by decoherence. This was realized in architectures based on nitrogen-vacancy centers, trapped ions, and Rydberg atoms. In superconducting systems, the idea of separating information storage and processing has led to experiments in which the qubit quantum state is stored in a high-quality microwave resonator (e.g. as a single photon or a multi-photon state), while the physical superconducting qubits are used only for short times during gate realizations.

Given the above, there is a need for systems and methods for quantum computation that are scalable and capable of achieving a high degree of fidelity and control.

SUMMARY

The present disclosure overcomes aforementioned drawbacks by providing a system and method for use in quantum computation.

In accordance with one aspect of the present disclosure a system for controlling qubits to perform quantum computation is provided. The system includes at least one superconducting quantum processor comprising a multi-qubit architecture having coupled qubits that are described by an anharmonic energy spectrum. The system also includes a microwave source connected to the at least one superconducting quantum processor, and configured to provide a microwave irradiation to at least one of the coupled qubits in the multi-qubit architecture to perform a gate on the at least one of the coupled qubits. The system further includes a controller configured to direct the microwave source to provide the microwave irradiation to at least one of the coupled qubits in the multi-qubit architecture.

In accordance with another aspect of the present disclosure, a method for controlling qubits to perform quantum computation is provided. The method includes providing at least one superconducting quantum processor comprising a multi-qubit architecture having coupled qubits that are described by an anharmonic energy spectrum. The method also includes generating, using a microwave source connected to at least one of the coupled qubits in the multi-qubit architecture, microwave irradiation that is configured to perform a gate on the at least one of the coupled qubits. The method further includes delivering the microwave irradiation using control circuits connected to the multi-qubit architecture and the microwave source.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The fluxonium qubit is a superconducting device that is formed using a small-area Josephson Junction shunted by a series of large-area Josephson junctions. As such, the fluxonium qubit combines strong Josephson nonlinearity with complete insensitivity to offset charges. In addition, and in contrast to the conventional transmon qubits, the fluxonium qubit has a strongly anharmonic spectrum, and shares many spectral features with a multi-level atomic system. Specifically, its two lowest energy states can have very long coherence times, and are thus suited well for quantum information storage. Higher energy states are separated by much larger energy separations, and have large transition matrix elements, making these states ideal for the information processing.

When biased at a half flux quantum, the lowest transition of a fluxonium qubit is an order of magnitude smaller in frequency than those to higher levels. Similar to conventional atomic systems, such frequency separation between computational and non-computational subspaces provides the opportunity for independent optimizations of the qubit coherence and two-qubit interactions.

Despite these advantages, conventional thinking has been that fluxonium qubits are hard to manipulate. In addition, it has been unclear how to couple multiple fluxonium qubits together. By contrast, the present disclosure provides a system and method for use in quantum information processing or quantum computation that includes a multi-qubit architecture. In addition, it is recognized herein that having fluxonium qubits decoupled from the environment is not an obstacle to qubit control. Moreover, higher transitions need not be ignored as in conventional practice, but may be used to achieve high fidelity gates. In some aspects, a controlled-Z (CZ) gate, activated by a microwave irradiation driven at a resonance of an excited state, is described for two coupled fluxonium qubits. Estimated results shown herein demonstrate that intrinsic gate fidelities of over 99.9% may be achieved for gate times below 100 ns.

Figure 1:
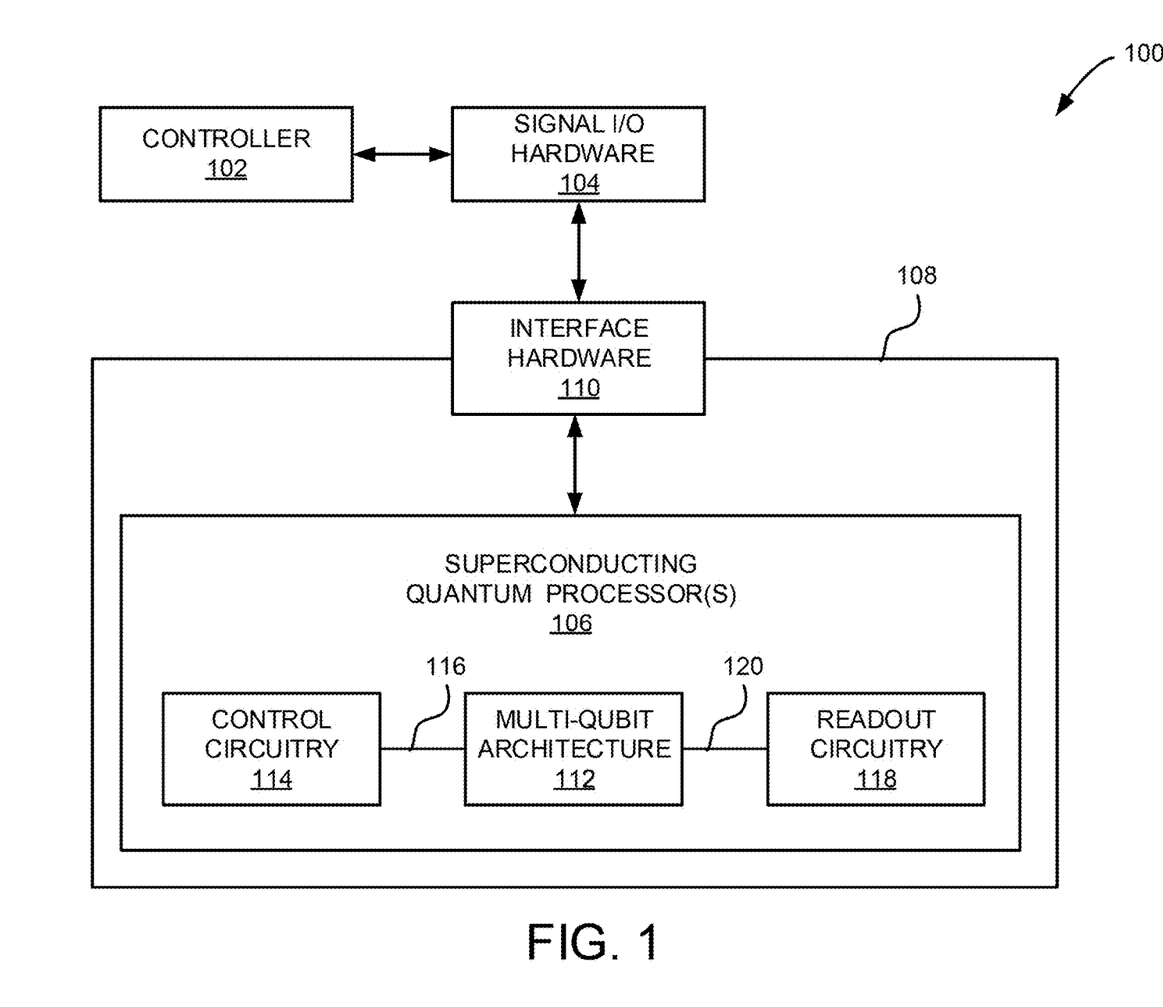
FIG. 1 is a schematic diagram of an example system for use in quantum computation, in accordance with the present disclosure.

Turning now to FIG. 1, an example system 100 for use in quantum information processing or quantum computation, in accordance with the present disclosure, is shown. In some embodiments, the system 100 may include a controller 102 and signal input/output (I/O) hardware 104 in communication with the controller 102. The system 100 may also include one or more superconducting quantum processors 106 contained in a housing unit 108. In addition, the system 100 may also include various interface hardware 110 for communicating and controlling signals between the signal I/O hardware 104 and the superconducting processor(s) 106.

The signal I/O hardware 104 may include various electronic systems, hardware and circuitry capable of a wide range of functionality. For example, the signal I/O hardware 104 may include various voltage sources, current sources, signal generators, amplifiers, filters, digitizers, mixers, multiplexers, voltmeters, digital/analog oscilloscopes, data acquisition cards, digital/analog signal processors, modulators, demodulators, and other equipment.

In some implementations, the signal I/O hardware 104 may include one or more microwave sources configured to produce and provide microwave irradiation to the superconducting processor(s) 106. The microwave irradiation may be configured, in terms of duration, amplitude and frequency, to be in resonance with one or more desired transitions. Also, the microwave irradiation may be configured to perform various gate operations, such as a controlled-Z gate operation for fixed-frequency fluxonium qubits, in accordance with aspects of the present disclosure.

To this end, the controller 102 may direct the signal I/O hardware 104 to provide various signals to the superconducting processor(s) 106, as well as detect signals therefrom via the interface hardware 110. The controller 102 may also control various other equipment of the system 100, such as various pumps, valves, and so forth. In some aspects, the controller 102 may include a programmable processor or combination of processors, such as central processing units (CPUs), graphics processing units (GPUs), and the like. As such, the controller 102 may be configured to execute instructions stored in a non-transitory computer readable-media. In this regard, the controller 102 may be any computer, workstation, laptop or other general purpose or computing device. Additionally, or alternatively, the controller 102 may also include one or more dedicated processing units or modules that may be configured (e.g. hardwired, or pre-programmed) to carry out steps, in accordance with aspects of the present disclosure.

The housing unit 108 is configured to control the environment to which the superconducting processor(s) 106 is exposed. For instance, the housing unit 108 may include various components and hardware configured to control the temperature of the superconducting processor(s) 106, as well as the liquid and/or gas mixture surrounding the superconducting processor(s) 106. In addition, the housing unit 108 may also be configured to control external noise signals, such as stray electromagnetic signals. To this end, the housing unit 108 may include various shielding units and filters. By way of example, the housing unit 108 may include, or be part of, a dilution refrigerator, or other low-temperature system or cryostat, that is capable of operating over a broad range of temperatures, including temperatures less than the critical temperature of the superconductor materials in the superconducting processor(s) 106 (e.g. temperatures less than 4 Kelvin).

The interface hardware 110 provides a coupling between the signal I/O hardware 104 and the superconducting quantum processor(s) 106, and may include a variety of hardware and components, such as various cables, wiring, RF elements, optical fibers, heat exchanges, filters, amplifiers, stages, and so forth.

As shown in FIG. 1, the superconducting processor(s) 106 may include a multi-qubit architecture 112 connected to control circuitry 114 by way of various control coupling(s) 116. The multi-qubit architecture 112 may include a number of qubits. In some embodiments, the multi-qubit architecture 112 includes qubits with an anharmonic energy spectrum, and preferably, qubits with a strongly anharmonic energy spectrum. Strongly anharmonic energy spectra, in particular, have a relative anharmonicity that may be equal to, or greater than, approximately 1.5, or equal to or greater than 3. By contrast, for a qubit with a non-strongly anharmonic energy or a weakly anharmonic energy spectrum, the relative anharmonicity can be close to or less than 1 when relative anharmonicity, $r_a$, refers to the ratio between a first transition frequency and a second transition frequency of the qubit. For instance, the first transition frequency may be the frequency to transition from the first excited state to the second excited state (i.e. $\omega_{1 \to 2}$), and the second transition may be the frequency to transition from the ground state and to the first excited state (i.e. $\omega_{0 \to 1}$), and so $r_a = \omega_{1 \to 2}/\omega_{0 \to 4}$. Under other definitions of relative anharmonicity, $r_a$ is defined as ratio between the detuning and the 0→1 transition frequency. That is, $r_a$ under an alternative definition can be $r_a = |\omega_{1 \to 2} - \omega_{0 \to 1}|/\omega_{0 \to 1}$. Under this alternative definition of $r_a$, a weak anharmonicity can be much less than 1, while a strong anharmonicity can be least 0.5.

The control circuitry 114 may be in communication with the signal I/O hardware 104, and configured to control qubits in the multi-qubit architecture 112 by providing various control signals thereto. Example control signals include microwave irradiation signals, current signals, voltage signals, magnetic signals, and so on. To this end, the control circuitry 114 may include any number of linear and non-linear circuit elements, such as Josephson junctions, inductors, capacitors, resistive elements, superconductive elements, transmission lines, waveguides, gates, and the like. The multi-qubit architecture 112 may also be connected to readout circuitry 118 via readout coupling(s) 120. The readout circuitry 118 may be configured to perform readout on qubits in the multi-qubit architecture 112, and provide corresponding signals to the signal I/O hardware 104. As non-limiting examples, the readout circuitry 118 may include various resonant cavities, logic circuits, as well as any number of linear and non-linear circuit elements, such as Josephson junctions, inductors, capacitors, resistive elements, superconductive elements, transmission lines, waveguides, gates, and the like.

Figure 2A:
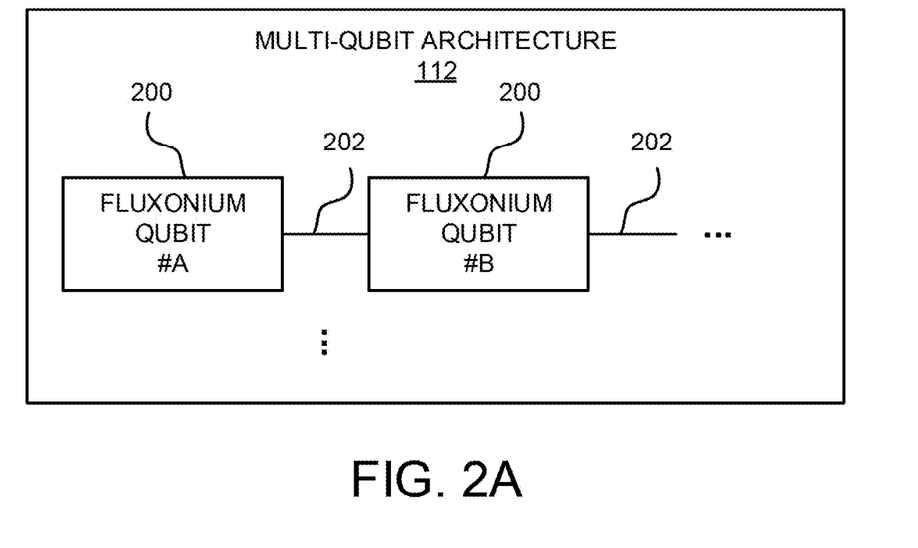
FIG. 2A is a schematic diagram of an example multi-qubit architecture, in accordance with aspects of the present disclosure.
Figure 2B:
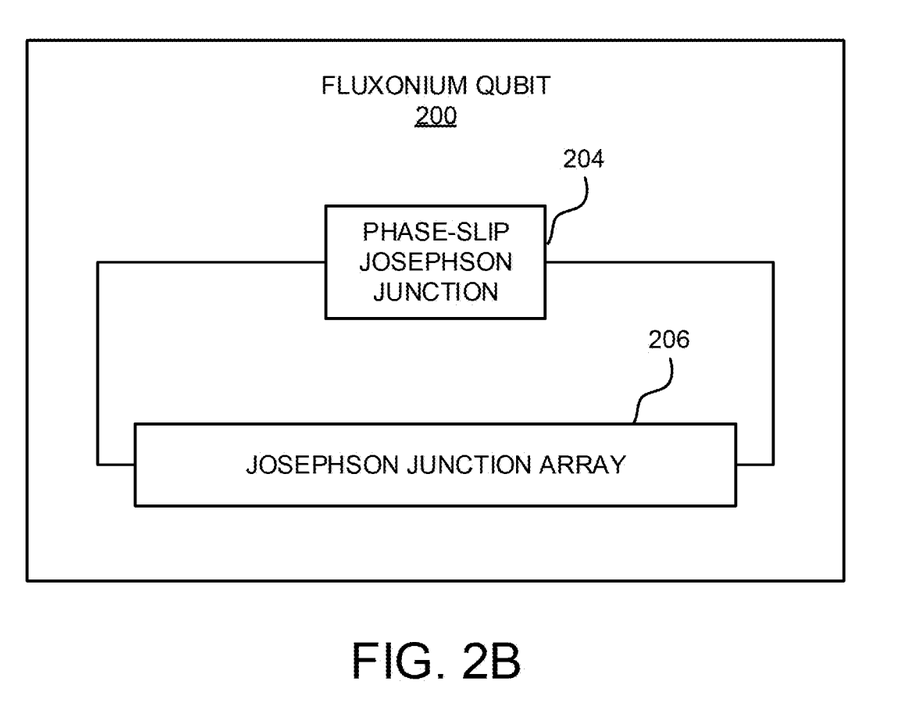
FIG. 2B is a schematic diagram of an example fluxonium qubit, in accordance with aspects of the present disclosure.
Figure 3A:
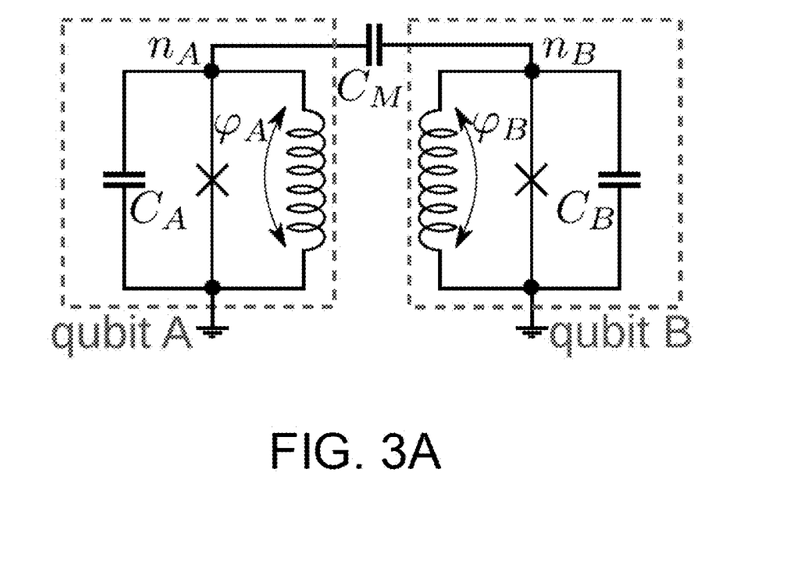
FIG. 3A is a circuit diagram of an example capacitively-coupled two-qubit architecture, in accordance with aspects of the present disclosure.
Figure 3B:
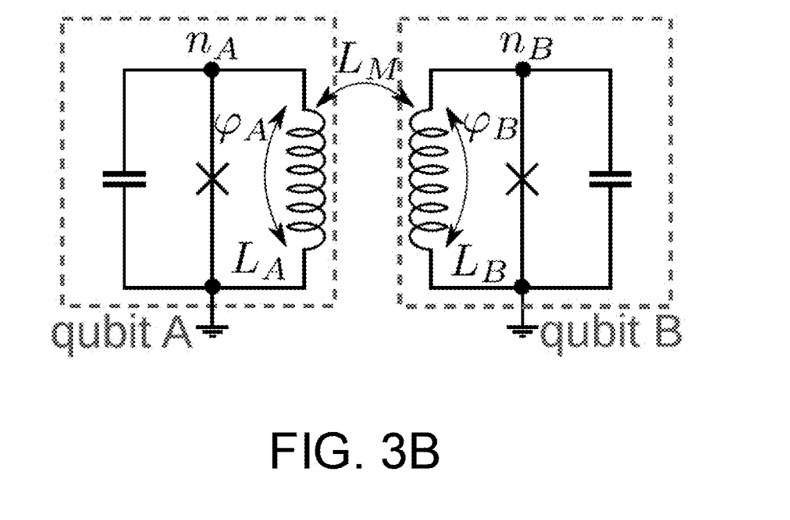
FIG. 3B is a circuit diagram of an example inductively-coupled two-qubit architecture, in accordance with aspects of the present disclosure.
Figure 3C:
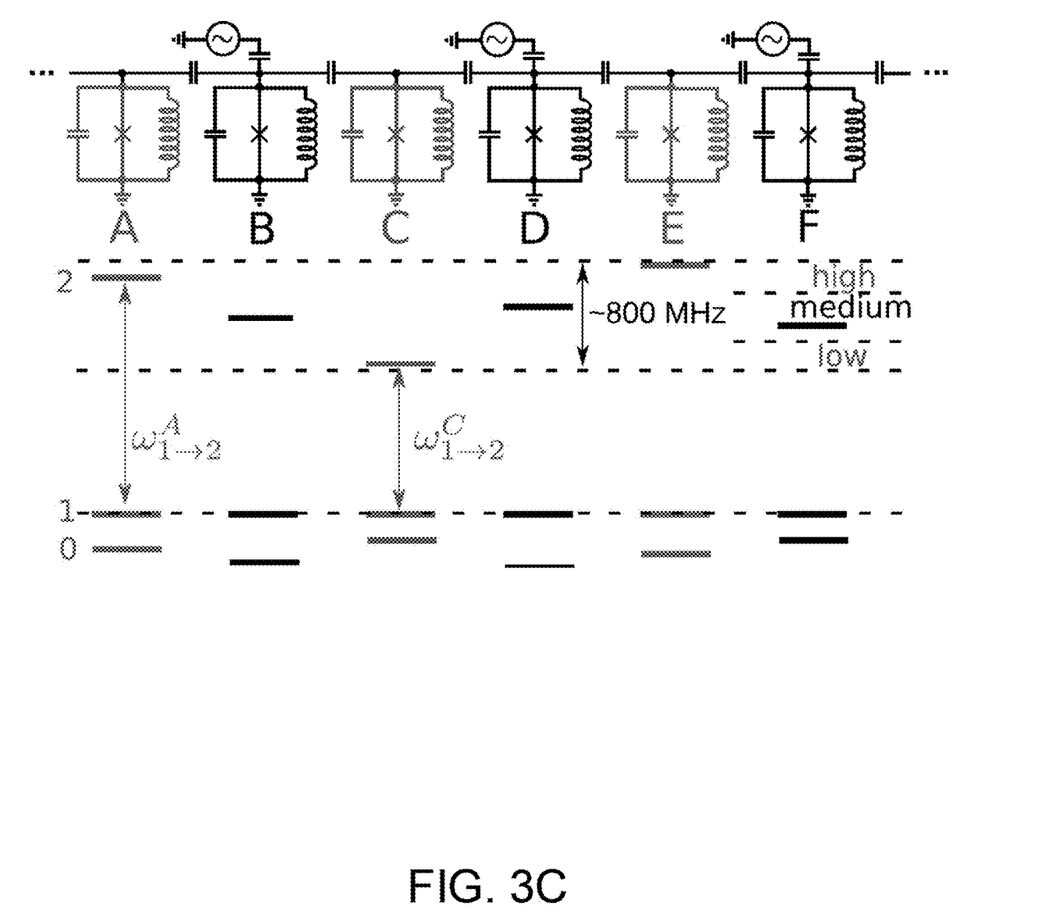
FIG. 3C is a circuit diagram of an example capacitively-coupled 1D-array qubit architecture, in accordance with aspects of the present disclosure.
Figure 3D:
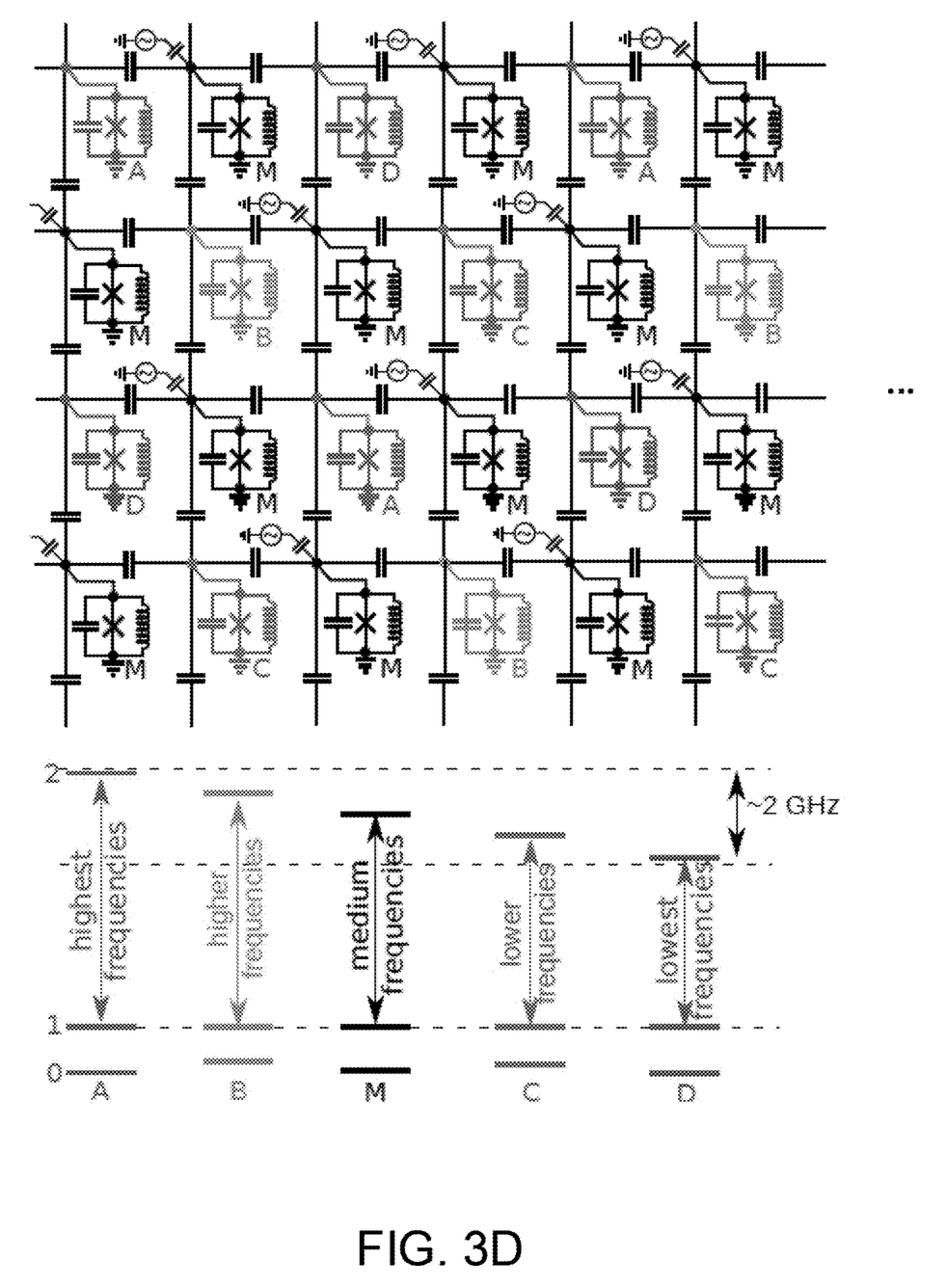
FIG. 3D is a circuit diagram of an example capacitively-coupled 2D-array qubit architecture, in accordance with aspects of the present disclosure.

In some configurations, the multi-qubit architecture 112 includes two or more fluxonium qubits 200 coupled by one or more qubit couplings 202, as shown in FIGS. 2A-B. The qubit couplings 202 may include capacitive or inductive couplings. Referring specifically to FIG. 2B, each fluxonium qubit 202 may include small-area, phase-slip Josephson Junction 204 connected, in parallel, to a Josephson junction array 206 that includes a number of large-area Josephson junctions. In some embodiments, the multi-qubit architecture 112 includes a one-dimensional (1D), a two-dimensional (2d) or a three-dimensional (3D) array of fluxonium qubits. In By way of example, FIGS. 3A-B show the circuit diagrams of two fluxonium qubits that are coupled capacitively by a capacitor $C_M$ (FIG. 3A), or inductively coupled by an inductance $L_M$ (FIG. 3B). In another example, FIG. 3C shows the circuit diagram of a multi-qubit architecture formed using a linear array of capacitively-coupled fluxonium qubits. As shown, the frequency or energy spectrum properties of the fluxonium qubits can vary across the array to allow two-qubit gate operations, in accordance with aspects of the present disclosure. For instance, qubit B in the figure has a "medium" frequency levels, and is coupled on one side by a qubit A with a "high(er)" frequency level, and on the other side by qubit C with a "low(er)" frequency level. As shown, the differences in the frequencies of the excited states may be approximately 800 MHz. In yet another example, FIG. 3D shows the circuit diagram of a multi-qubit architecture formed using a two-dimensional array of capacitively-coupled fluxonium qubits. The frequency spectrum properties of the array can be arranged in a "checkerboard"-like pattern, where each "medium" frequency qubit is coupled to two qubits having excited states with higher frequencies (i.e. "higher" and "highest"), and also to two qubits having excited states with lower frequencies (i.e. "lower" and "lowest"). As shown, the differences in the frequencies of the excited states may span approximately 2 GHz. As described, other arrangements or topologies, including 3D topologies, of capacitively coupled fluxonium qubits may be possible.

Figure 4A:
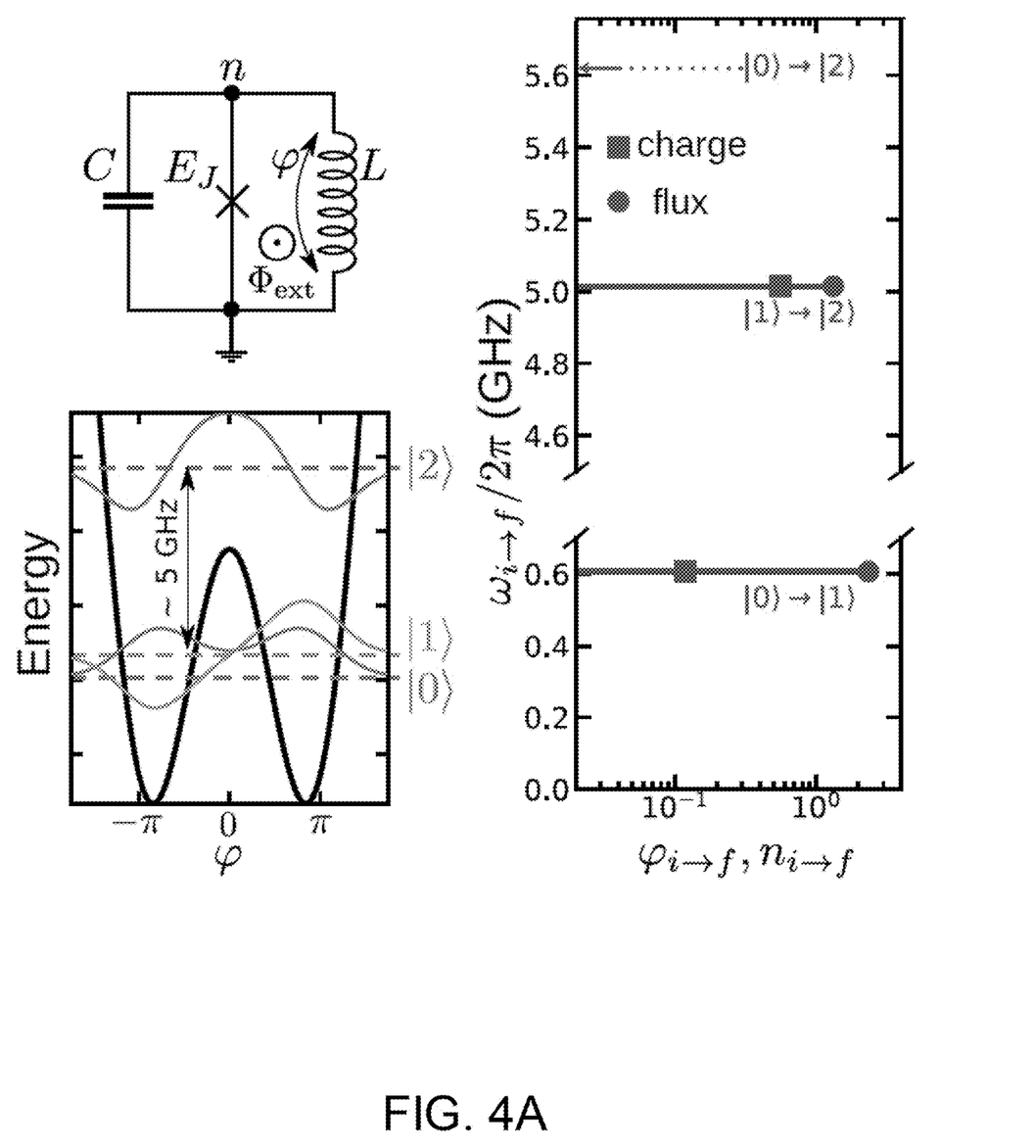
FIG. 4A is a graphical illustration showing a circuit diagram of a single fluxonium qubit, its lowest three energy levels, and magnitudes of charge and flux matrix elements for transitions between the three energy levels.

Referring now to FIG. 4A, as described, a fluxonium superconducting circuit generally includes a long Josephson-junction array, with total inductance $L_\alpha$, that shunts a phase-slip Josephson junction, where the $\alpha$=A or B refers to each qubit of a two-qubit architecture. The circuit may be characterized by three energy scales, namely the charging energy $E_{C,\alpha} = e^2/2C_\alpha$, the inductive energy $E_{L,\alpha} = (\hbar/2e)^2/L_\alpha$, and the Josephson energy $E_{j,\alpha}$, where $-e$ is the electron charge, $C_\alpha$ is the total capacitance, and $\hbar = h/2\pi$ is the Planck constant. With an external flux $\Phi_{ext,\alpha} = (\hbar/2e)(\phi_{ext,\alpha})$, threading the loop formed by the Josephson junction and the inductance, the Hamiltonian of fluxonium $\alpha$ may be written as:

$$\hat{H}_\alpha^{(0)} = 4E_{C,\alpha}\hat{n}_\alpha^2 + \frac{1}{2}E_{L,\alpha}\hat{\varphi}_\alpha^2 - E_{J,\alpha}\cos(\hat{\varphi}_\alpha - \phi_{ext,\alpha}). \quad (1)$$

Here, $\hat{\varphi}_\alpha$ and $\hat{n}_\alpha$ are the generalized flux and charge (Cooper-pair number) operators that satisfy $[\hat{\varphi}_\alpha,\hat{n}_\alpha]=i$. The energies of the fluxonium qubit may be selected by tuning various characteristics of the fluxonium qubit, such as the dimensions of the device, the number of Josephson junctions in the array, the critical currents of the junctions, and so on. In one non-limiting example of a two-qubit architecture (i.e. a fluxonium qubit A coupled to a fluxonium qubit B), the energies may be selected such that $E_{C,A}/h=1.5$ GHz, $E_{C,B}/h=1.2$ GHz, $E_{J,A}/h=5.5$ GHz, $E_{J,B}/h=5.7$ GHz, and $E_{L,A}/h=E_{L,A}/h=1$ GHz, although other energy values may be possible. To note, unlike transmons, it is not required that $E_{L,\alpha}/E_{C,\alpha}$ is large because fluxonium qubits are insensitive to charge noise.

When biased at one half of magnetic flux quantum ($\phi_{ext,\alpha}=\pi$), the fluxonium is at its sweet spot with respect to the flux noise. The corresponding potential energy is shown in FIG. 4A, along with three lowest eigenenergies $\varepsilon_k^\alpha$ and eigenfunctions $|k_\alpha\rangle$. The lowest two levels may be used as the qubit computational states. They are the symmetric and antisymmetric combinations of the states localized at the two potential minima. The splitting between them is determined by the tunneling rate between the wells, which gives relatively small $\omega_{0\to 1}^\alpha/2\pi\sim 500$ MHz, where $\omega_{i\to f}^\alpha=\varepsilon_f^\alpha-\varepsilon_i^\alpha)/h$ is the frequency of the $|i_\alpha\rangle\to|f_\alpha\rangle$ transition. On the other hand, $\omega_{1\to 2}^\alpha/2\pi\sim 5$ GHz, which facilitates strong coupling and fast gates.

The hierarchies of single-qubit transition frequencies and matrix elements of flux and charge of qubit A are shown in 4A. Each fluxonium level has a well-defined even or odd parity with respect to $\varphi\to -\varphi$, implying selection rules for matrix elements, which are exactly zero for two levels of the same parity. Thus, $\varphi_{0\to 2}^\alpha=n_{0\to 2}^\alpha=0$, where $O_{i\to f}^\alpha=|\langle i_\alpha|\hat{O}|f_\alpha\rangle|$ is the magnitude of the single-qubit matrix element ($\hat{O}=\hat{\varphi}$ or $\hat{n}$). Among the allowed transitions, $\varphi_{0\to 1}^\alpha\leq\varphi_{1\to 2}^\alpha$ and $n_{0\to 1}^\alpha\ll n_{1\to 2}^\alpha$, where $n_{0\to 1}^\alpha$ is suppressed due to relatively weak tunneling between the wells. The relation between the charge and flux matrix elements can be found by computing $[\hat{\varphi},\hat{H}_\alpha^{(0)}]$, which yields $\omega_{i\to f}^\alpha\varphi_{i\to f}^\alpha=8\,E_{C,\alpha}n_{i\to f}^\alpha$.

Figure 4B:
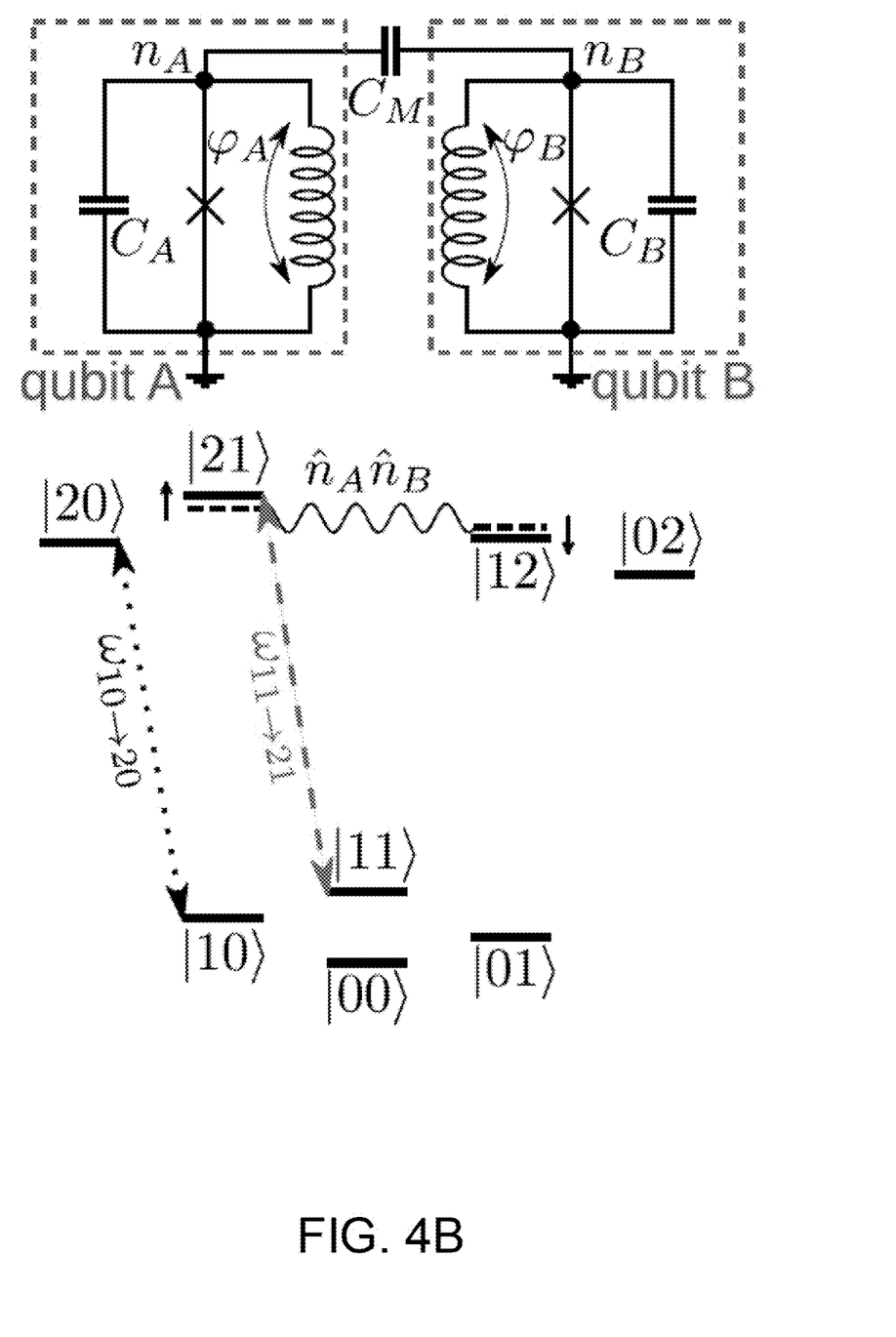
FIG. 4B is a graphical illustration showing a circuit diagram of two capacitively-coupled fluxonium qubits and corresponding energy spectra in the presence of the interaction.

As described, in some implementations, fluxonium qubits may be capacitively coupled via a capacitor $C_M$. Referring specifically to FIG. 4B, the Hamiltonian of such two-qubit system may be written as $$\hat{H}=\hat{H}_A^{(0)}+\hat{H}_A^{(0)}+\hat{V}+\hat{H}_{drive} \quad (2)$$

where $\hat{V}$ is the qubit-qubit interaction and $\hat{H}_{drive}$ describes the external microwave drive. In the limit $C_M\ll C_A,C_B$, one may obtain $$\hat{V}=J_C\hat{n}_A\hat{n}_B \text{ with } J_C=4e^2 C_M/C_A C_B \quad (3)$$

where $n_\alpha$ is the total charge on $C_\alpha$ and the corresponding side of $C_M$. It is noted that $C_M$ also slightly renormalizes $E_{C,\alpha}$. For simplicity, it may be assumed that the drive is directly applied to the qubits:

$$\hat{H}_{drive}=f(t)\cos(\omega_d t)(\eta_A\hat{n}_A+\eta_B\hat{n}_B). \quad (4)$$

In Eqn. 4, f(t) describes the shape or amplitude of the microwave pulse, and $\eta_{A,B}$ are the effective strengths of qubit couplings to the microwave field.

The notation $|kl\rangle$ may be used for an eigenstate of $\hat{H}$ with $\hat{H}_{drive}=0$, which may be adiabatically connected to the non-interacting eigenstate $|kl\rangle_0=|kA\rangle|l_B\rangle$. The notation $n_{\alpha i\to f}$ may be extended to two-qubit transitions, where $|i\rangle=|kl\rangle$ and $|f\rangle=|k'l'\rangle$, and $\omega_{kl\to k'l'}$ represents the frequencies of such transitions.

As described, qubits may be operated by applying a CZ gate, as follows. When $\hat{V}=0$, $\omega_{10\to 20}=\omega_{11}=\omega_{1\to 2}^A$. A non-zero $\hat{V}$ lifts this degeneracy, and the gate can be realized by selectively driving Rabi oscillations between states $|11\rangle$ and $|21\rangle$, as shown in FIG. 4B. The state $|11\rangle$ accumulates an extra phase factor of $e^{i\pi}$ after one oscillation. If an ideal pulse shape f(t) is assumed, when other transitions (e.g. $|10\rangle\to|20\rangle$) are not affected, the computational subspace $\{|00\rangle,|01\rangle,|10\rangle,|11\rangle\}$ can evolve according to the CZ gate operator $\hat{U}_{CZ}=\text{diag}(1,1,1,-1)$ up to single-qubit Z gates.

The hierarchy of single-qubit $n_{\alpha i\to f}$ (as shown in FIG. 4A) has two important consequences: (i) $\hat{H}_{drive}$ couples stronger to the $|1\rangle\to|2\rangle$ transition than to the $|0\rangle\to|1\rangle$; (ii) $\hat{V}$ leads to much stronger hybridization (level repulsion) between noncomputational states $|21\rangle$ and $|12\rangle$ (FIG. 4B) than computational ones because $n_{1\to 2}^A n_{1\to 2}^B\gg n_{0\to 1}^A n_{0\to 1}^B$. As a result, the second-order correction to the energy of state $|21\rangle$ is larger, by a factor of several hundred, compared to those to the energies of states $|10\rangle$ and $|11\rangle$. Since $n_{0\to 2}^\alpha=n_{2\to 2}^\alpha=0$, the state $|20\rangle_0$ does not acquire the perturbative shift from nearby levels $|02\rangle_0,|21\rangle_0$, and $|12\rangle_0$, making $\omega_{11\to 21}\neq\omega_{10\to 20}$.

The gate rate, characterized by the frequency mismatch $\Delta\omega=\omega_{11\to 21}-\omega_{10\to 20}$, increases with decreasing $\delta=|\omega_{1\to 2}^A-\omega_{1\to 2}^B|$, which is approximately 248 MHz for the above-described selection of parameters. In general, smaller $\delta$ may lead to faster and better performing gates. A conservative choice of $\delta\sim 250$ MHz may be motivated by device fabrication uncertainty in a physical implementation of the CZ gate. In some aspects, the two-qubit Hamiltonian of Eqn. 2 may be numerically diagonalized at $\hat{H}_{drive}=0$, to determine $\Delta\omega$ and $n_{kl\to k'l'}^\alpha$ as a function of the interaction strength $J_C$. These results are shown in graphs (a) and (b) of FIG. 5A. As shown, $\Delta\omega$ increases monotonically with increasing $J_C$ (solid line in graph (a)). In addition, $\Delta\omega$ increases much faster than $\Delta_c=\omega_{00\to 01}-\omega_{10\to 11}$, the phase accumulation rate in the computational subspace. The on-off ratio of the CZ gate is $\Delta\omega/\Delta c\sim 100$ for the selected parameters.

Figure 5A:
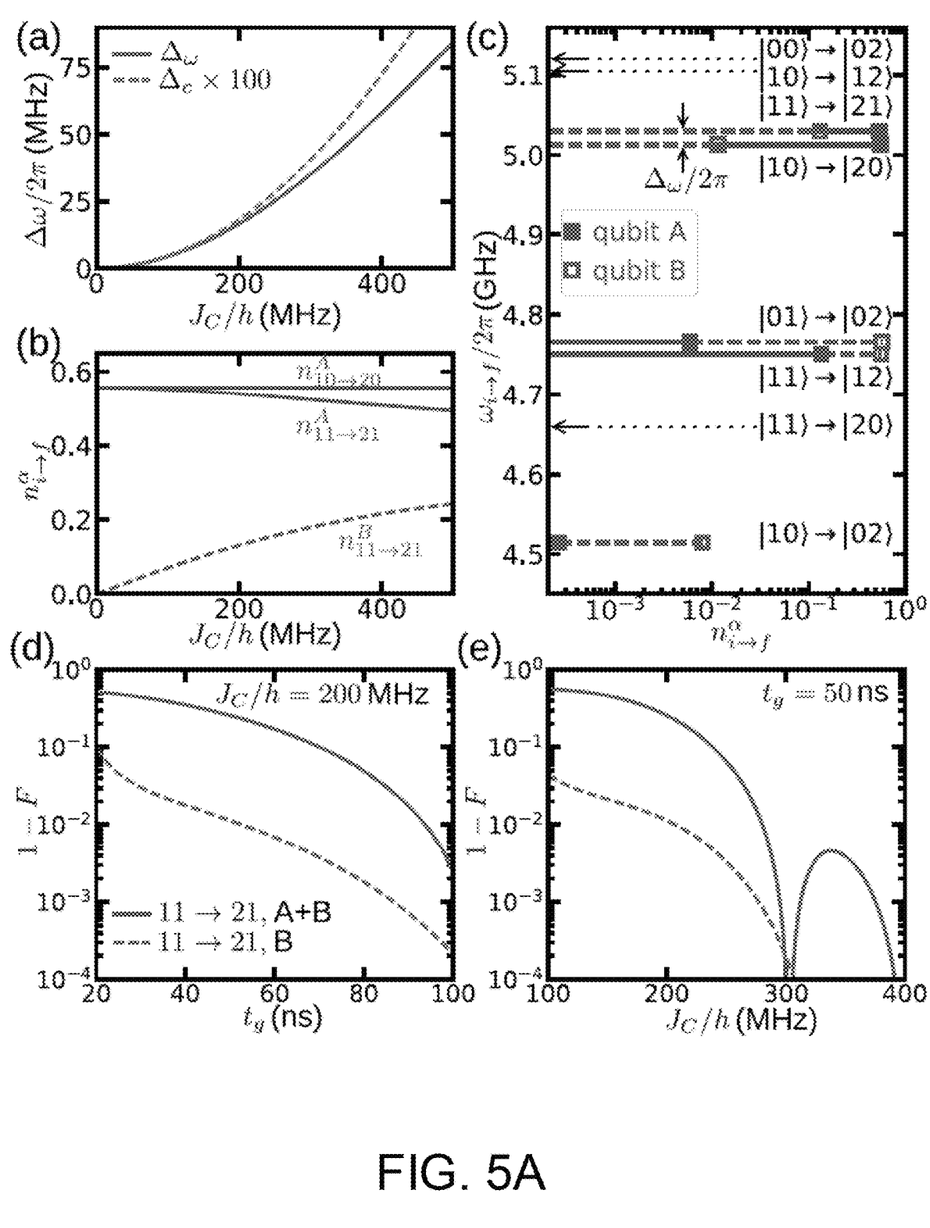
FIG. 5A is a graphical illustration showing (a) frequency mismatch and phase accumulation rate versus interaction strength, (b) matrix element amplitudes versus interaction strength, (c) transition frequencies and matrix elements at fixed interaction strength, and gate error as a function of: (d) gate time for fixed interaction strength, and (e) interaction strength for fixed gate time, with microwave drive being applied selectively to one or both qubits of two capacitively-coupled fluxonium qubits.

The matrix elements panel (graph (b) in FIG. 5A) illustrates strong mixing between $|12\rangle_0$ and $|21\rangle_0$. While $n_{10\to 20}^A\approx n_{1\to 2}^A$ at finite $J_C$, the value of $n_{11\to 21}^A$ decreases with increasing $J_C$ since the dressed state $|21\rangle$ is a superposition of non-interacting states $|12\rangle_0$ and $|21\rangle_0$. For the same reason, $n_{11\to 21}^B\approx 0$ for $J_C\neq 0$. Graph (c) of FIG. 5A illustrates how much other transitions with frequencies close to $\omega_{11\to 21}$ may be activated because of the finite width of the drive spectrum. Specifically, since $n_{11\to 21}^B\gg n_{10\to 20}^B$, undesirable activation of $|10\rangle\to|20\rangle$ can be suppressed by applying the drive selectively to qubit B ($\eta_A=0$). Noteworthy, certain matrix elements $n_{kl\to k'l'}^\alpha$, remain equally zero for $\hat{V}\neq 0$. All two-qubit levels $|kl\rangle$ can be separated into two families depending on the parity of k+l. To higher orders, $\hat{V}$ mixes only levels with the same parity of k+l, while $\hat{n}_\alpha$ only connects levels with different parities of k+l. Also, $n_{10\to 12}^\alpha=0$ when $J_C\neq 0$, while $n_{10\to 02}^B\neq 0$.

To model the gate operation, the evolution operator $\hat{U}(t)$ may be obtained by integrating numerically $i\hbar\partial(t)/\partial t=\hat{H}\hat{U}(t)$. For a desired gate time $t_g$, a Gaussian envelope may be considered for the drive, namely $f(t)=A\{\exp[-8t(t-t_g)/t_g^2]-1\}$, where A and the drive frequency $\omega_d$ may be optimized within a 15 MHz window, for example, around $\omega_{11\to 21}$. In some implementations, more complicated pulses generated using optimal control theory or other periodic excitations of qubits, such as SFQ pulses, may also be applicable. The evolution operator in the two-qubit computational subspace may be represented by a non-unitary 4×4 matrix $\hat{U}_c$ defined by its matrix elements $[\hat{U}_c]_{kl,k'l'}=\langle kl|\hat{U}(t_g)|k'l'\rangle$, where $|kl\rangle$,

|k'l'⟩∈{|00⟩,|01⟩,|10⟩,|11⟩}. To compare $\hat{U}_C$ with the ideal operator $\hat{U}_{CZ}$, two instant single-qubit Z-rotations may be applied to get $\hat{U}_c'=\hat{U}_Z\hat{U}_c$, where $\hat{U}_Z$=diag[1, $e^{i\delta\phi_{01}}$, $e^{i\delta\phi_{01}+ei\delta\phi^1}$], $\delta\phi_{kl}=\phi_{kl}-\phi_{00}$, and $\phi_{kl}=-\arg\{[\hat{U}_c]_{kl,kl}\}$. The averaged gate fidelity may then be calculated according to:

$$F=[Tr(\hat{U}_c'^\dagger \hat{U}_c')+|Tr(\hat{U}_{CZ}^\dagger \hat{U}_c')|^2]/20. \quad (5)$$

The gate error 1-F as a function of $t_g$ and $J_C$ is shown in graphs (d) and (e) of FIG. 5A, where the microwave drive is applied to both qubits ($\eta_A=\eta_B=1$, solid lines, as a worst-case scenario without local microwave control lines for each qubit), and selectively to qubit B ($\eta_A=0$, $\eta_B=1$, dashed lines). As seen from the figure, the gate error is lower in the second case. When the drive is applied to both qubits, $J_C/h$ may be greater than or approximately equal 200 MHz to achieve the 99% fidelity threshold within $t_g=100$ ns. For the selective drive of a single qubit, the same interaction strength of 200 MHz leads to the 99% fidelity for a shorter gate time of 50 ns, and a 99.9% fidelity is possible at $t_g\approx 90$ ns. A 99.9% threshold can be achieved at $t_g=50$ ns for both designs provided $J_C$ is sufficiently large. Gate error can be reduced further with more advanced microwave-pulse shaping.

Figure 4C:
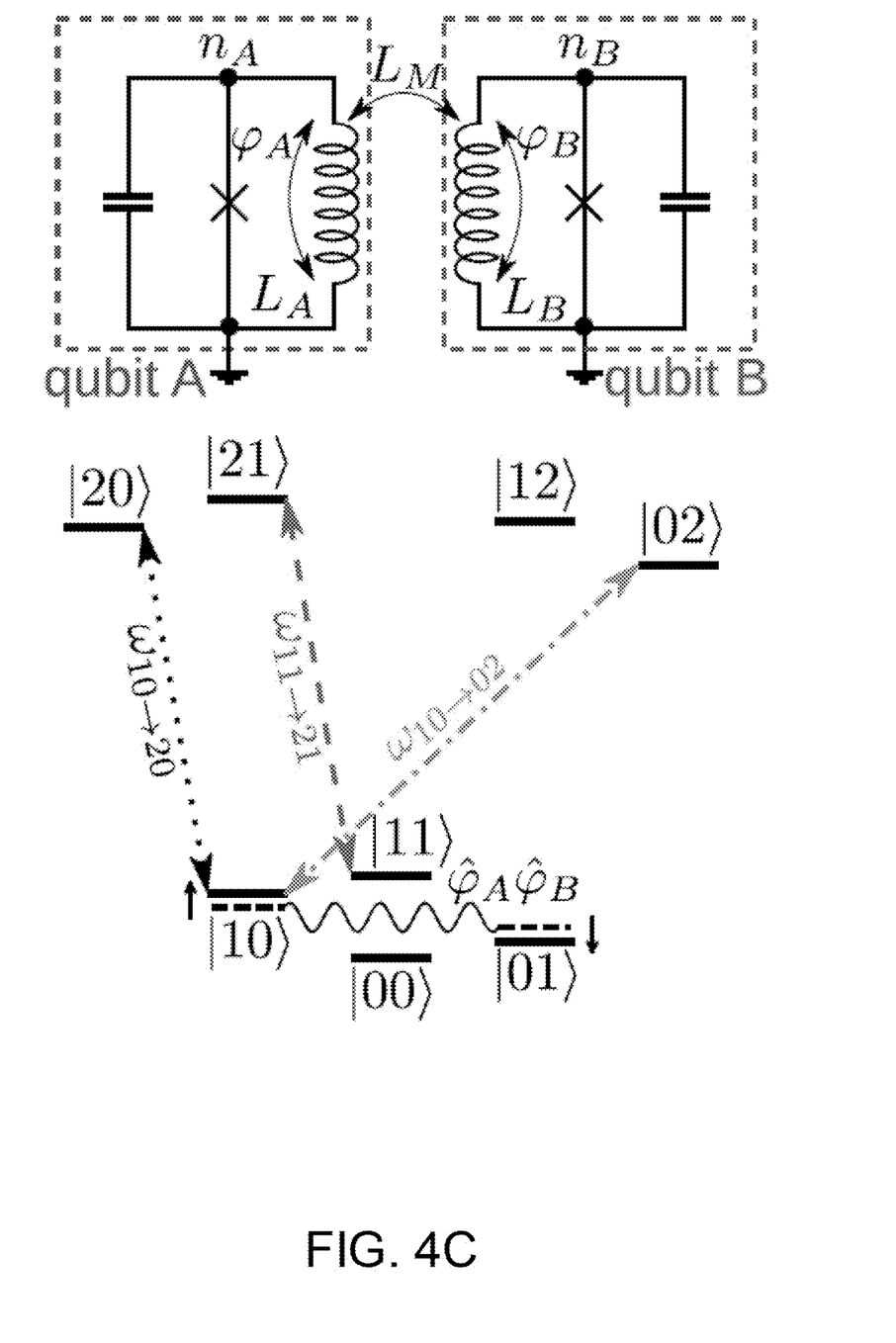
FIG. 4C is a graphical illustration showing a circuit diagram of two inductively-coupled fluxonium qubits and corresponding energy spectra in the presence of the interaction.
Figure 5B:
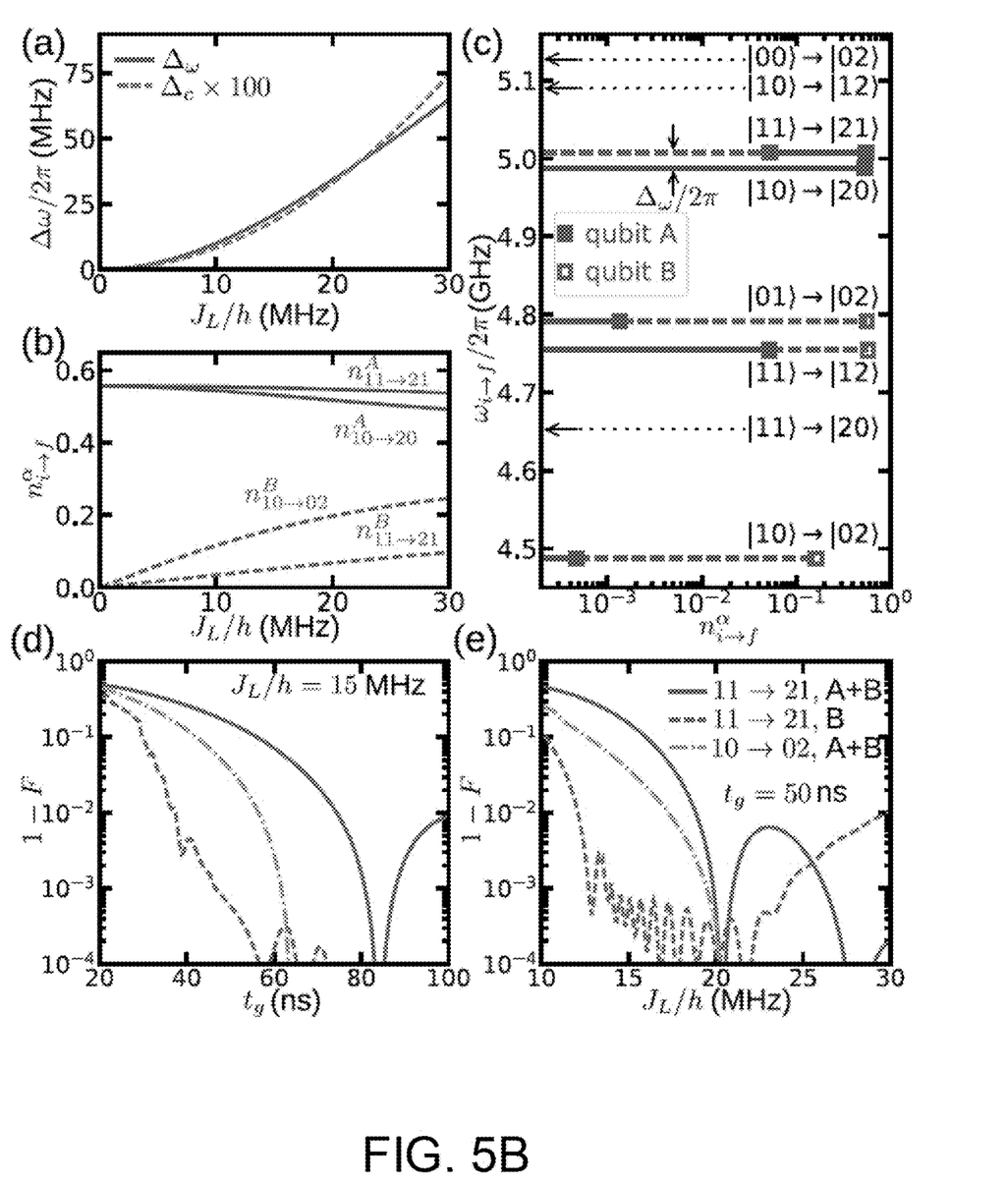
FIG. 5B is another graphical illustration showing (a) frequency mismatch and phase accumulation rate versus interaction strength, (b) matrix element amplitudes versus interaction strength, (c) transition frequencies and matrix elements at fixed interaction strength, and gate error as a function of: (d) gate time for fixed interaction strength, and (e) interaction strength for fixed gate time, with microwave drive being applied selectively to one or both qubits of two inductively-coupled fluxonium qubits.

As shown in FIG. 4C, an inductive coupling may be used for fluxonium qubits via a mutual inductance $L_M\ll L_A, L_B$. The interaction $\hat{V}$ in Eq. (2) may have the form:

$$\hat{V}=-J_L\hat{\phi}_A\hat{\phi}_B \text{ with } J_L=(\hbar/2e)^2 L_M/L_A, \quad (6)$$

and $E_{L,\alpha}$ is the renormalized inductive energy. The interaction effects within the computational subspace are important for inductive coupling. Nevertheless, this does not affect the phase accumulation rate $\Delta c$ since nonzero contributions from repulsion between computational levels exactly cancel in $\Delta c$. Moreover, similarly to the capacitive coupling, $\Delta c \ll \Delta\omega$ (graph (a) in FIG. 5B), allows for the same CZ gate by driving at $\omega_{11\to 21}$. The frequency mismatch $\Delta\omega$ now occurs primarily because of the repulsion between |10⟩$_0$ and |01⟩$_0$ rather than |21⟩$_0$ and |12⟩$_0$, as illustrated by the wavy line in FIG. 4C. This can be seen in the matrix elements of graph (b) in FIG. 5B. In contrast to capacitive coupling, $n_{11\to 21}^B$ does not grow as fast with the interaction strength, while $n_{10\to 20}^A$ decreases. The transition |10⟩→|02⟩ acquires a relatively large matrix element, allowing for another way of activating the CZ gate. Driving this transition can be advantageous since it can be better separated in frequency from other allowed transitions (graph (c) in FIG. 5B) for the parameters selected. In this case, state |10⟩ changes sign, while other states are nearly unaffected, and an additional $Z_\pi$=diag(1,$e^{i\pi}$) gate applied to qubit A will reduce the gate to its standard form $\hat{U}_{CZ}$.

Gate errors for the inductive coupling are shown in graphs (d) and (e) of FIG. 5B. If the selective single-qubit drive is not possible, then driving at $\omega_{10\to 02}$ may be a better option than driving at $\omega_{11\to 21}$. The selective drive at $\omega_{11\to 21}$ further reduces the gate error at a reasonably small interaction strength ($J_L/h<20$ MHz) or short gate time ($t_g<60$ ns). The non-monotonic behavior in the gate fidelity [solid and dashed line in graph (e)] may be explained by a decrease in separation between $\omega_{01\to 02}$ and $\omega_{11\to 21}$ with increasing $J_L/h$ and a relatively large value $n_{01\to 02}^B$.

As shown, inductive and capacitive interactions between two fluxonium qubits can produce gate fidelities of 99.9% within 100 ns gate times. In some implementations, capacitive coupling scheme may be easier to realize but may necessitate controlling the drive amplitude at both qubits, similar to the operation of the cross-resonance gate. On the other hand, an inductive coupling is much less sensitive to cross-talks and state leakage, but may necessitate fine-tuning of single-qubit gates or tunable couplers.

This disclosure suggests that fluxonium qubits, or similar strongly anharmonic inductively shunted qubits, can be a potential upgrade to the mainstream transmons as building blocks for a large quantum information processor. While transmon qubits face the challenges of anharmonicity-limited gate speed and a lifetime limited by surface material (T1<100 μs), a fluxonium biased at half flux quantum can provide coherence times of hundreds of microseconds. In addition, coherence times could be further improved beyond 1 millisecond based on state-of-the-art values of the surface loss tangent and the 1/f flux noise amplitude.

The extraordinary lifetime of the fluxonium |0⟩→|1⟩ transition is partially enabled by nature of its very low (sub-GHz) frequency. Rather than a weakness for quantum computation, this feature can be a virtue. Specifically, the energy relaxation rate due to dielectric loss is proportionally slower at low frequencies at a constant Q-factor (in fact, Q usually improves at lower frequencies). In addition, although fluxonium qubits operate in a relatively "hot" environment due to their low qubit frequency, a practical quantum processor will likely employ an active qubit state initialization, such as measurement feedback for either rapid reset or suppressing non-equilibrium excitations. The fidelity of the state initialization directly benefits from long T1 time.

As explained, the present CZ gate is made possible by the rich energy level structure of fluxonium qubits, and separation of its well-protected memory space from strongly-interacting states. However, the present concept is not limited to fluxonium qubits, and may be applied to other strongly anharmonic qubits with a hierarchy of transition matrix elements, such as variants of flux qubits. In practice, the performance of the proposed CZ gate will likely depend on qubit coherence times and will likely be limited by the T2 time of the |2⟩ state, which is accessed during the gate. Because the approximately 5 GHz |1⟩→|2⟩ transition is similar to transmon transitions, it should be possible to achieve T2 time on the order of 50 μs with today's technology, limiting incoherent error to less than 0.1%. Therefore, the CZ gate for fixed-frequency fluxonium qubits provides a quite promising pathway towards the long-coveted 99.9% fidelity two-qubit gates.

Figure 6:
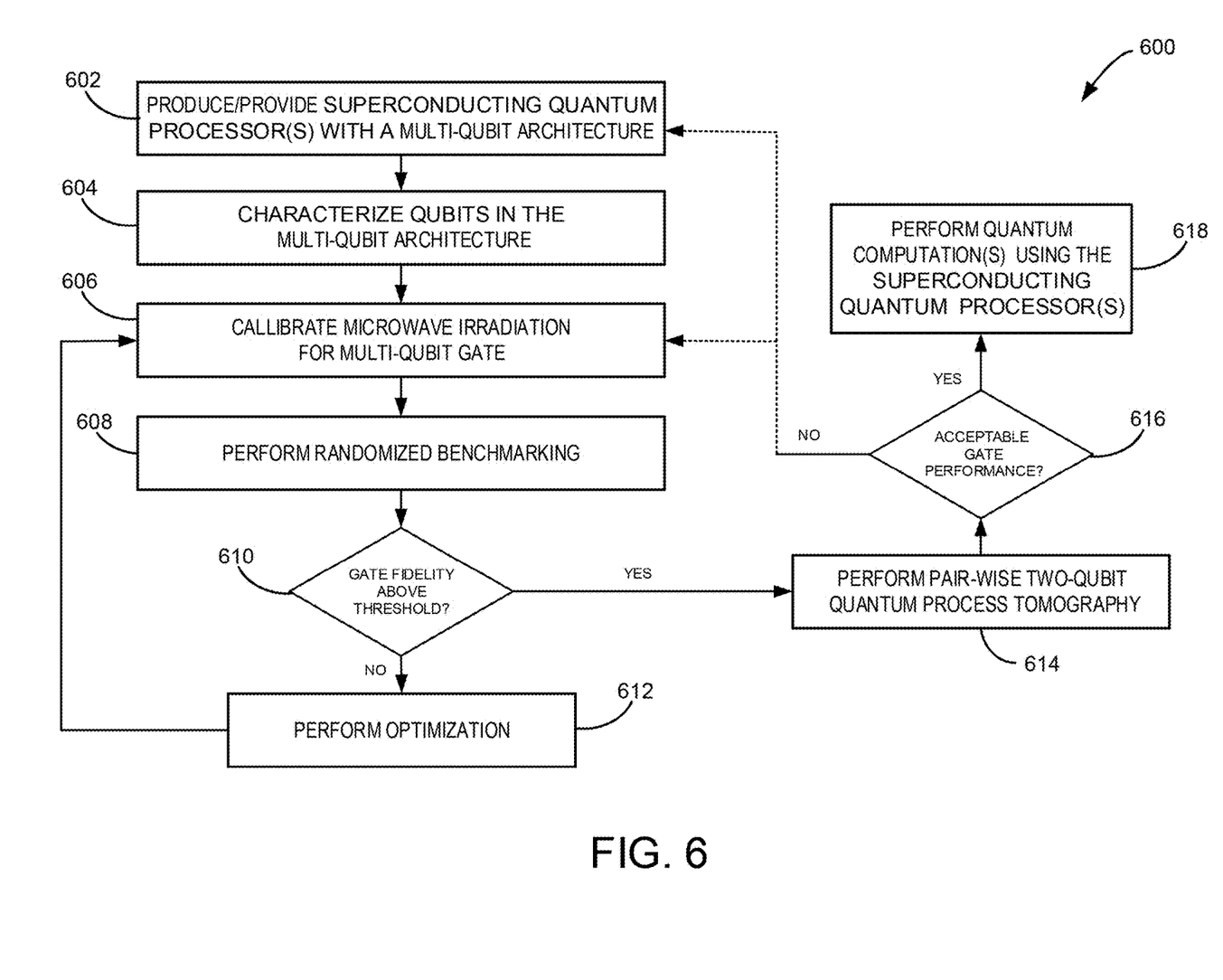
FIG. 6 is a flowchart setting forth steps of a process, in accordance with aspects of the present disclosure.

Referring now to FIG. 6, a flowchart is shown setting forth steps of an example process 600 for use in a quantum computation, in accordance with the present disclosure, is shown. Steps of the process 600 may be carried out using any suitable device, apparatus or system, such as systems described herein. Also, steps of the process 600 may be implemented as a program, firmware, software, or instructions that may be stored in non-transitory computer readable media and executed by a general-purpose, programmable computer, processor or other suitable computing device. In some implementations, steps of the process 600 may also be hardwired in an application-specific computer, processor or dedicated module.

The process 600 may begin at process block 602 with steps for producing and providing one or more superconducting quantum processor(s) with a multi-qubit architecture. As described, the multi-qubit architecture may include two or more coupled qubits, such as fluxonium qubits. To this end, process block 602 may include various steps of designing and fabricating qubits with desired properties, including target qubit energies (e.g., $E_J$, $E_c$, $E_L$), qubit addressability, qubit types and coupling strengths, and so forth. Once produced, qubits in the multi-qubit architecture may be characterized, as indicated by process block 604, to verify that the desired properties. For instance, qubit spectroscopy techniques may be used to identity the energy spectra and transitions of the qubits.

Then, at process block 606, a calibration of the microwave irradiation for a multi-qubit gate may be performed. In particular, the calibration may include determining the frequency, duration, and shape of microwave irradiation necessary to perform a controlled-Z gate, and achieve qubit control, as desired. For instance, the calibration may be used to determine a microwave irradiation that selectively drives Rabi oscillations between an initial state and a final state of one, or both, qubits in a two-qubit architecture. As described, the induced transitions may be between a first excited state and a second excited state. In some aspects, the determined microwave irradiation may be configured to induce a predetermined phase factor, such as $e^{i\pi}$, for example, in a target qubit state. By way of example, the microwave irradiation may include a pulse (e.g. a Gaussian pulse) with a drive frequency between approximately 3 GHz and approximately 7 GHz, and duration between approximately 10 and approximately 100 ns, although other values may be possible. In some aspects, the drive frequency may be within a frequency window (e.g. approximately 25 MHz, or less) around a state transition. As described, the microwave irradiation may also include more complicated pulses (e.g. generated using optimal control theory) or other periodic excitations of qubits (e.g. SFQ pulses).

In some aspects, a randomized benchmarking process may be carried out, as indicated by process block 608. A gate fidelity may then be estimated, and a determination made whether the gate fidelity exceeds a predetermined threshold, as indicated by decision block 610. For example, the predetermined threshold may be 90% or more specifically 99%, although other values may be possible.

If the estimated gate fidelity does not exceed the predetermined threshold, an optimization may be performed at process block 612, and the calibration step at process block 606 may be repeated. The optimization may include various techniques, including Nelder-Mead, CMA-ES, and so on. If the estimated gate fidelity exceeds the predetermined threshold, a pair-wise qubit quantum process tomography may be performed, as indicated by process block 614. In some aspects, the gate performance may be evaluated at decision block 616. Should gate performance be acceptable, the superconducting quantum processor(s) may be used to perform various quantum computation steps, as indicated by process block 618. Otherwise, the calibration step at process block 606 may be repeated, as shown in FIG. 6. In some cases, the superconducting quantum processor(s) may be re-designed or fabricated, beginning with process block 602.

As used herein, the terms "about," "approximately," and other equivalents, when used in relation to one or more nominal values, may include the specified nominal value(s) and variations of up to 10% from the specified nominal value(s).

The present invention has been described in terms of one or more preferred embodiments, and it should be appreciated that many equivalents, alternatives, variations, and modifications, aside from those expressly stated, are possible and within the scope of the invention.

The invention claimed is:

1. A system for controlling qubits to perform quantum computation, the system comprising:
   at least one superconducting quantum processor comprising a multi-qubit architecture having coupled qubits that are described by an anharmonic energy spectrum;
   a microwave source connected to the at least one superconducting quantum processor, and configured to provide a microwave irradiation to at least one of the coupled qubits in the multi-qubit architecture to perform a multi-qubit gate operation on the at least one of the coupled qubits; and
   a controller configured to direct the microwave source to provide the microwave irradiation to at least one of the coupled qubits in the multi-qubit architecture.

2. The system of claim 1, wherein the multi-qubit architecture comprises two or more fluxonium qubits.

3. The system of claim 2, wherein the two or more fluxonium qubits are capacitively or inductively coupled.

4. The system of claim 1, wherein the multi-qubit architecture comprises a one-dimensional array of fluxonium qubits that are capacitively coupled together, wherein a first transition frequency ($\omega_{1\to2}$) of neighboring qubits differs by up to approximately 800 MHz.

5. The system of claim 4, wherein at least one of the fluxonium qubits in the one dimensional array is capacitively connected to the microwave source.

6. The system of claim 1, wherein the multi-qubit architecture comprises a two-dimensional array of fluxonium qubits that are capacitively coupled together, wherein a first transition frequency ($\omega_{1\to2}$) of neighboring qubits differs by up to approximately 2 GHz.

7. The system of claim 6, wherein at least one of the fluxonium qubits in the two-dimensional array is capacitively connected to the microwave source.

8. The system of claim 1, wherein the controller is further configured to perform a calibration to determine a frequency, a duration and an amplitude of the microwave irradiation.

9. The system of claim 1, wherein the multi-qubit gate operation is a controlled-Z gate operation.

10. A method for controlling qubits to perform quantum computation, the system, the method comprising:
    providing at least one superconducting quantum processor comprising a multi-qubit architecture having coupled qubits that are described by an anharmonic energy spectrum;
    generating, using a microwave source connected to in the multi-qubit architecture, microwave irradiation that is configured to perform a multi-qubit gate operation on the at least one of the coupled qubits; and
    delivering the microwave irradiation using control circuits connected to the multi-qubit architecture and the microwave source.

11. The method of claim 10, wherein the multi-qubit architecture comprises two or more fluxonium qubits.

12. The method of claim 11, wherein the two or more fluxonium qubits are capacitively or inductively coupled.

13. The method of claim 10, wherein the multi-qubit architecture comprises a one-dimensional array of fluxonium qubits that are capacitively coupled together, wherein a first transition frequency ($\omega_{1\to2}$) of neighboring qubits differs by up to approximately 800 MHz.

14. The method of claim 13, wherein at least one of the fluxonium qubits in the one dimensional array is capacitively connected to the microwave source.

15. The method of claim 10, wherein the multi-qubit architecture comprises a two-dimensional array of fluxonium qubits that are capacitively coupled together, wherein a first transition frequency ($\omega_{1\to2}$) of neighboring qubits differs by up to approximately 2 GHz.

16. The method of claim 15, wherein at least one of the fluxonium qubits in the two-dimensional array is capacitively connected to the microwave source.

17. The method of claim 10, wherein the method further comprises performing a calibration to determine a frequency, a duration and an amplitude of the microwave irradiation.

18. The method of claim 10, wherein the multi-qubit gate operation is a controlled-Z gate operation.

19. The method of claim 10, wherein the method further comprises driving Rabi oscillations between excited states of the coupled qubits in the multi-qubit architecture.

20. The method of claim 10, wherein a relative anharmonicity of the anharmonic energy spectrum, defined by a ratio between a first transition frequency ($\omega_{1\to 2}$) and a second transition frequency ($\omega_{0\to 1}$), is greater than approximately 1.5.

* * * * *